United States Patent
Takahashi et al.

(10) Patent No.: US 6,232,819 B1
(45) Date of Patent: *May 15, 2001

(54) SEMICONDUCTOR INTEGRATED CIRCUIT DEVICE AND LOW-AMPLITUDE SIGNAL RECEIVING METHOD

(75) Inventors: Toshiro Takahashi, Hamura; Kazuo Koide, Iruma, both of (JP)

(73) Assignee: Hitachi, Ltd., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 09/504,076

(22) Filed: Feb. 15, 2000

Related U.S. Application Data

(63) Continuation of application No. 08/736,694, filed on Oct. 25, 1996, now Pat. No. 6,087,879.

(30) Foreign Application Priority Data

Oct. 26, 1995 (JP) .................................................. 7-302100

(51) Int. Cl.[7] .................................................. H03K 5/01
(52) U.S. Cl. .......................................... 327/333; 327/331
(58) Field of Search ................................. 327/51–53, 56, 327/57, 65–67, 77, 88, 89, 208–215, 218; 326/63, 68–74, 80, 81

(56) References Cited

U.S. PATENT DOCUMENTS

| | | | |
|---|---|---|---|
| 4,181,865 | * 1/1980 | Kohyama | 327/208 |
| 4,511,810 | 4/1985 | Yukawa | 327/52 |
| 4,558,241 | * 12/1985 | Suzuki et al. | 327/208 |
| 4,785,206 | * 11/1988 | Hoshi | 327/208 |
| 4,910,713 | 3/1990 | Madden et al. | 327/52 |
| 4,943,738 | * 7/1990 | Hoshi | 327/89 |
| 4,973,864 | 11/1990 | Nogami | 327/208 |
| 5,023,475 | * 6/1991 | Ducourant | 327/218 |
| 5,023,488 | 6/1991 | Gunning | 526/86 |
| 5,148,061 | * 9/1992 | Hsueh et al. | 327/219 |
| 5,461,333 | 10/1995 | Condon et al. | 327/333 |
| 5,530,392 | 6/1996 | Runas et al. | 327/333 |
| 5,534,812 | 7/1996 | Cao et al. | 327/333 |
| 5,594,368 | 1/1997 | Usami | 326/63 |

FOREIGN PATENT DOCUMENTS 2-37823   2/1990 (JP) ..................................... 327/333

OTHER PUBLICATIONS

Chappell et al., "Fast CMOS ECL Receivers with 100–nV Worst–Case Sensitivity", IEEE Journal of Solid–State Circuits, vol. 23, No. 1, Feb. 1988, pp. 59–67.

* cited by examiner

*Primary Examiner*—Tuan T. Lam
(74) *Attorney, Agent, or Firm*—Antonelli, Terry, Stout & Kraus, LLP

(57) ABSTRACT

When signal transmission is performed between two semiconductor integrated circuit devices in synchronization with a clock signal using a small signal amplitude relative to an operating voltage of the two semiconductor integrated circuit devices, a received signal is held in the receiving semiconductor integrated circuit device in synchronization with the clock signal while the small signal amplitude of the held signal is kept substantially without change. The received signal having the small signal amplitude is amplified along a signal transmission path including a combined logic circuit to a subsequent latch circuit of the receiving semiconductor integrated circuit device.

4 Claims, 8 Drawing Sheets

US 6,232,819 B1

SEMICONDUCTOR INTEGRATED CIRCUIT DEVICE AND LOW-AMPLITUDE SIGNAL RECEIVING METHOD

CROSS REFERENCE TO RELATED APPLICATION

This application is a continuation of application Ser. No. 08/736,694, filed Oct. 25, 1996 now U.S. Pat. No. 6,087,879, the entire disclosure of which is hereby incoporated by reference.

FIELD OF THE INVENTION

The present invention relates to a semiconductor integrated circuit device and a method of receiving a low-amplitude signal and, more particularly, to an input circuit for transmitting a signal between semiconductor integrated circuit devices as a low-amplitude signal and a method of receiving such a low-amplitude signal.

BACKGROUND OF THE INVENTION

In TTL (Transistor-Transistor-Logic) level or CMOS (Complementary Metal-Oxide-Semiconductor) level arrangements widely used for interfaces between CMOS semiconductor integrated circuit devices, irregular reflections are caused at both ends of a signal transmission line, so that it is known that data transfer frequencies are limited in performance to 60 MHz to 100 MHz at most. On the other hand, in pseudo ECL (Emitter Coupled Logic) and GTL (Gurnning Transceiver Logic) arrangements, the data transfer frequency is raised by connecting a terminating resistor to the end of a signal transmission line to prevent the reflection of the waveform.

However, in order to reduce power consumption, the signal amplitude is limited to about 0.8 V (volt) relative to 5 V (volt) or 3.3 V (volt) of the operating or the supply voltage of a semiconductor integrated circuit device.

A pseudo ECL arrangement is described in IEEE JOURNAL OF SOLID-STATE CIRCUITS, Vol. 23, No. 1, February 1988, PP. 59–67. A GTL arrangement is disclosed in U.S. Pat. No. 5,023,488 (Jan. 11, 1991).

SUMMARY OF THE INVENTION

Along with the advancement in micro fabrication technology for semiconductor integrated circuit elements, attempts for enhancing the speed of CMOS semiconductor integrated circuit devices are being made. As the operating speed of circuits internal to semiconductor integrated circuit devices increases, the present inventors came to notice that the data transfer speed between semiconductor integrated circuit devices would eventually lag behind the operating speed, bottlenecking the enhancement of the performance of an entire system. The present inventors reviewed the data transfer between semiconductor integrated circuit devices to achieve the present invention.

It is therefore an object of the present invention to provide a structure with a simple construction for providing high-speed data transfer between semiconductor integrated circuit devices.

It is a further object of the present invention to provide a method of receiving a low-amplitude signal at a high speed in a semiconductor integrated circuit device.

Other and further objects, features, and advantages of the invention will appear more fully from the following description taken in connection with the accompanying drawing.

The present invention will be outlined in one aspect as follows.

Namely, an input buffer or an input circuit in the semiconductor integrated circuit device is provided that has a latch circuit for receiving an input signal entered in synchronization with a clock signal and provided with a low amplitude relative to an amplitude between a first and a second supply voltage for the semiconductor integrated circuit device and holding this received signal with its amplitude kept correspondingly small.

In carrying out the invention, and according to another aspect thereof, there is provided a method of receiving a low-amplitude signal wherein, when signal transmission is performed between at least a pair of semiconductor integrated circuit devices in synchronization with a clock signal using a small signal amplitude relative to an amplitude between a first and a second supply voltage for the semiconductor integrated circuit devices, a received signal is held on the receiving semiconductor integrated circuit device in synchronization with the clock signal with the small signal amplitude kept without change. Then, the received signal having the small signal amplitude is amplified along a signal transmission path including a combined logic circuit and provided to a succeeding latch circuit in the receiving semiconductor integrated circuit device.

DETAILED DESCRIPTION

Figure 1:
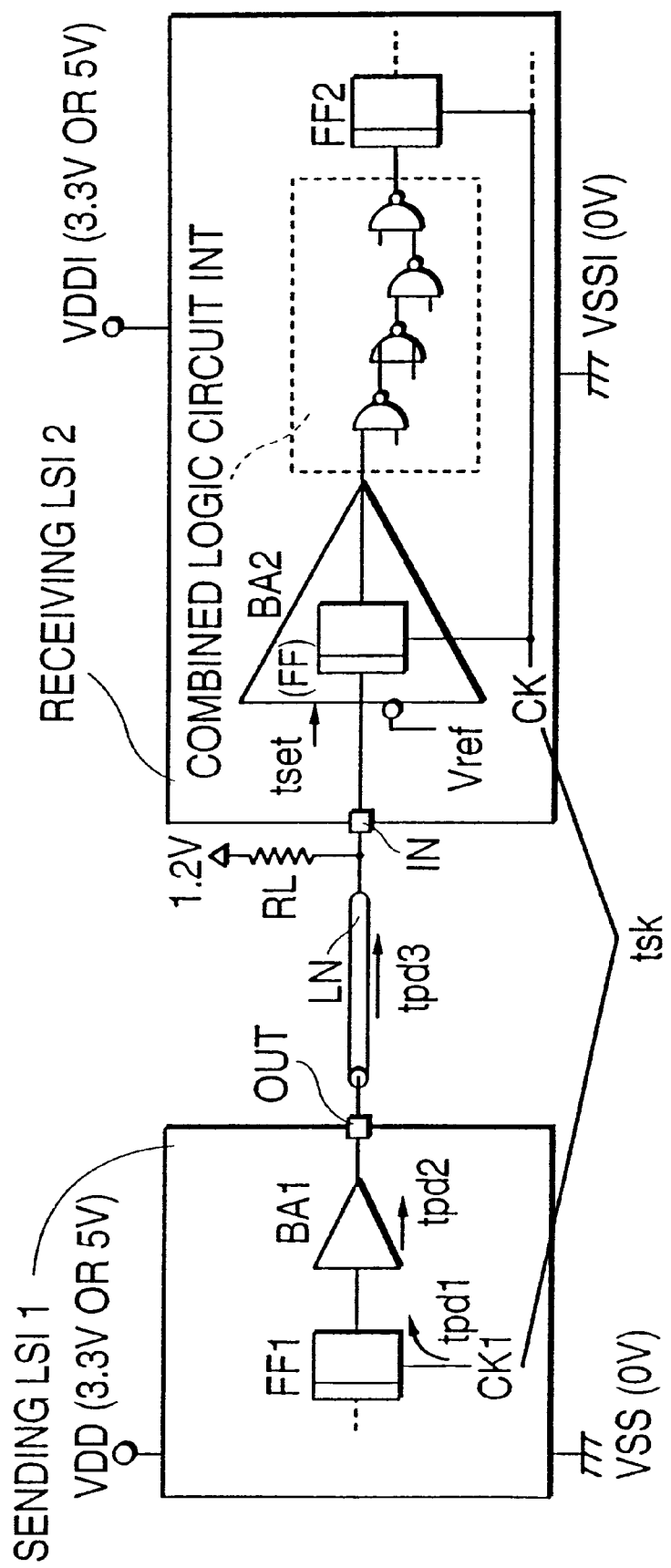
FIG. 1 is a schematic block diagram illustrating one embodiment of the present invention.

FIG. 1 shows a schematic block diagram illustrating one embodiment of the present invention. In the figure, a sending LSI (Large Scale semiconductor Integrated circuit device) 1 and a receiving LSI 2 constituting one signal transmission path are illustrated typically. The sending LSI 1 and the receiving LSI 2 are formed on a single semiconductor substrate, respectively. The sending LSI 1 is supplied with a supply voltage VDD (3.3 V or 5 V) as a first supply voltage and a ground voltage VSS (0V) as a second supply voltage. The receiving LSI 2 is supplied with a supply voltage VDD1 (3.3 V or 5 V) as a first supply voltage and a ground voltage VSS1 (0V) as a second supply voltage.

At the sending LSI 1, a signal latched in a latch (flipflop) circuit FF1 in synchronization with a clock signal CK 1 is transmitted to a transmission line LN via an output buffer (an output circuit) BA1 as a GTL circuit. The transmission line LN is terminated with a terminating resistor RL matched to its characteristic impedance. The output buffer BA1 of the sending LSI 1 is formed, but not necessarily, by an open-drain output MOSFET (Metal-Oxide-Semiconductor Field Effect Transistor) to be connected to a predetermined low voltage such as 1.2 V (volt) with the terminating resistor RL corresponding to a GTL level circuit. In this case, the drain of the output MOSFET is connected to an external output terminal OUT of the sending LSI 1 and the source of the output MOSFET is connected to a line to which the ground voltage VSS is supplied. This allows a signal of a low voltage such as 0.8 V to be transmitted to the transmission line LN in such a manner that the low level of the transmitted signal becomes about 0.4 V corresponding to a voltage difference between the source and drain voltage of the output MOSFET being in on state. The high level becomes a voltage of 1.2 V which is supplied to the terminating resistor RL.

In the above GTL circuit, the terminating resistor RL is set to a small value such as 50 ohms corresponding to the characteristic impedance of the transmission line LN. Also, steps are taken to prevent a large direct current from flowing through the terminating resistor RL when a low-level signal (0.4V) is transmitted, which would undesirably increase power consumption. Specifically, instead of using the operating voltages such as 5 V and 3.3 V on the sending LSI and the receiving LSI, a voltage to which the terminating resistor RL is connected is lowered to 1.2 V, for example. The transmission signal thus provided with a low amplitude is latched by an input buffer BA2 provided on the input section of the receiving LSI 2 via an external input terminal IN.

In this embodiment, in order to substantially increase the signal transmission speed in the low amplitude as mentioned above, the input buffer BA2 latches the input signal with the low amplitude kept without change and is incorporated with a latch circuit FF that holds the input signal approximately at that level. Namely, the input buffer BA2 is provided with the latch circuit FF that holds the input signal with the low amplitude kept as it is. This latch circuit FF captures and holds the signal in synchronization with the clock signal CK whose frequency is identical to that of the clock signal CK1 and which corresponds to a system clock in the receiving LSI 2.

In the receiving LSI 2, an output signal of the input buffer BA2 is transmitted to a latch circuit FF2 of the next stage through a combined logic circuit INT. As described above, the receiving LSI 2 is constituted by logic circuits as an internal logic circuit which operate on a large voltage difference between the first and the second operating voltages VDD1 and VSS1 relative to the signal amplitude (0.8V) of the transmitted input signal. Therefore, in order to provide a suitable input signal for the logic circuits, it is required to amplify the low-amplitude signal to an internal signal of the high level corresponding to the first supply voltage (3.3V or 5V) or of the low level corresponding to ground potential (0V) of the circuit.

In this embodiment, the transmission speed in the internal logic circuit can be enhanced by making circuit elements more and more microscopic in size. The setting of the speed of the transmission with the next stage latch circuit FF2 has far more freedom than that of the signal transmission between the semiconductor integrated circuit devices (the sending LSI 1 and the receiving LSI 2) by optimally designing the number of logic stages and the like. Thus, the setting is for allocating a time for the low-amplitude signal to be amplified to a signal of full amplitude corresponding to the voltage difference between the first and the second supply voltage.

The time required for the signal transmission in this embodiment is a total sum of a delay time tpd1 in the latch circuit FF1 in the sending LSI 1, a delay time tpd2 in the output buffer BA1, a delay time tpd3 in the transmission line LN, a setup time set in the latch circuit FF in the input buffer BA2 in the receiving LSI 2 and a clock skew (worst case) between the clock CK1 and the clock CK. The reciprocal number of this sum is made a data transfer frequency.

Figure 8:
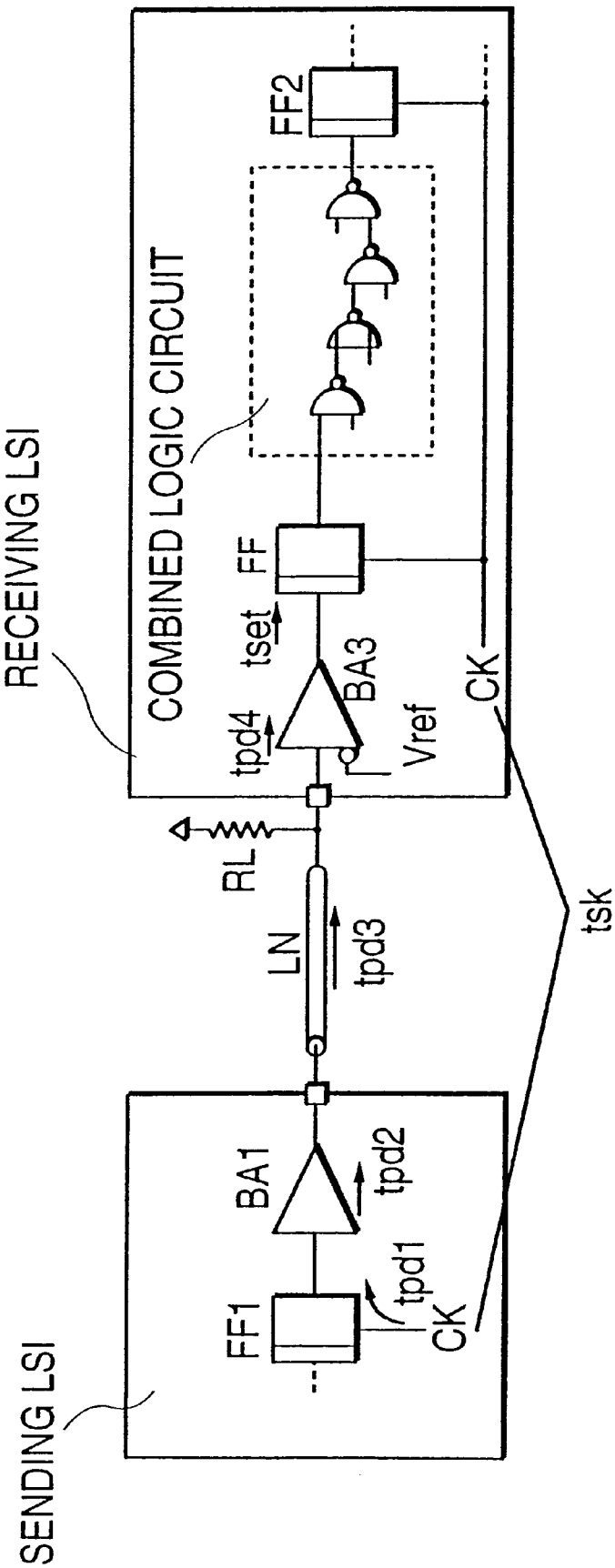
FIG. 8 is a schematic block diagram describing an example of the small-amplitude data transfer examined by the present inventors before achieving the present invention.

On the other hand, if, in a receiving LSI of FIG. 8 examined by the inventors before achieving the present invention, an input buffer BA3 is provided, a low-amplitude signal is amplified by the input buffer BA3, and the amplified receive signal is latched in a latch circuit FF, an excess delay time tpd4 is required for amplifying the signal amplitude of 0.8 V to a signal amplitude of 3.3 V or 5 V.

The signal delay tpd4 in the input buffer BA3 in FIG. 8 not only is for simply transmitting the signal but also requires the amplification of the signal amplitude as described above, so that the delay time is comparatively large. For example, the delay time tpd1 in the latch circuit FF1 on the sending LSI is 1 ns, the delay time tpd2 in the output buffer BA1 is 2 ns, the delay time tpd3 in the transmission line LN is 2 ns, the setup time tset in the latch circuit FF in the low-voltage input buffer BA2 in the receiving LSI is 0.5 ns, and the clock skew (worst case) between the clock CK1 and the clock CK is 0.5 ns. The signal delay tpd4 in the input buffer BA3 is about 2 ns.

Consequently, in a constitution in which the low-amplitude signal is amplified by the input buffer BA3 as shown in FIG. 8 and the amplified receive signal is held in the latch circuit FF, the total sum of delay times amounts to 8 ns, thereby limiting the transmission frequency to 125 MHz. On the other hand, in the constitution of the present embodiment in which the receive signal is held by the input buffer BA2 with the low amplitude kept as it is, the total sum of delay times is reduced to 6 ns, so that the transmission frequency can be increased to 167 MHz, for example.

As shown above, the input buffer BA2 holds the signal with its low amplitude kept as it is, so that the time of about 2 ns as described above is required to amplify the signal to be entered in the combined logic circuit to the full amplitude level corresponding to the voltage difference between the first and the second supply voltage. Hence, a simple solution can be attained by taking measures such as limiting the number of logic stages such that the total sum of signal delay times in the combined logic circuits that receives the output signal of the input buffer BA2 becomes less than 6 ns including the delay time of 2 ns spent for the amplifying operation.

In most cases, the total sum of delay times in the combined logic circuit INT in internal circuits is shorter than the signal delay time between the semiconductor integrated circuit devices (LSI1 and LSI 2). Besides, the speed can be enhanced by making the circuit elements more and more microscopic. Therefore, the above-mentioned total sum of delay times presents no problem in practice. Even if the delay time in the combined logic circuit INT is large, it can be simply taken care of, in internal circuits, by dividing the delay time into two and inserting a dummy latch circuit, for example.

Figure 2:
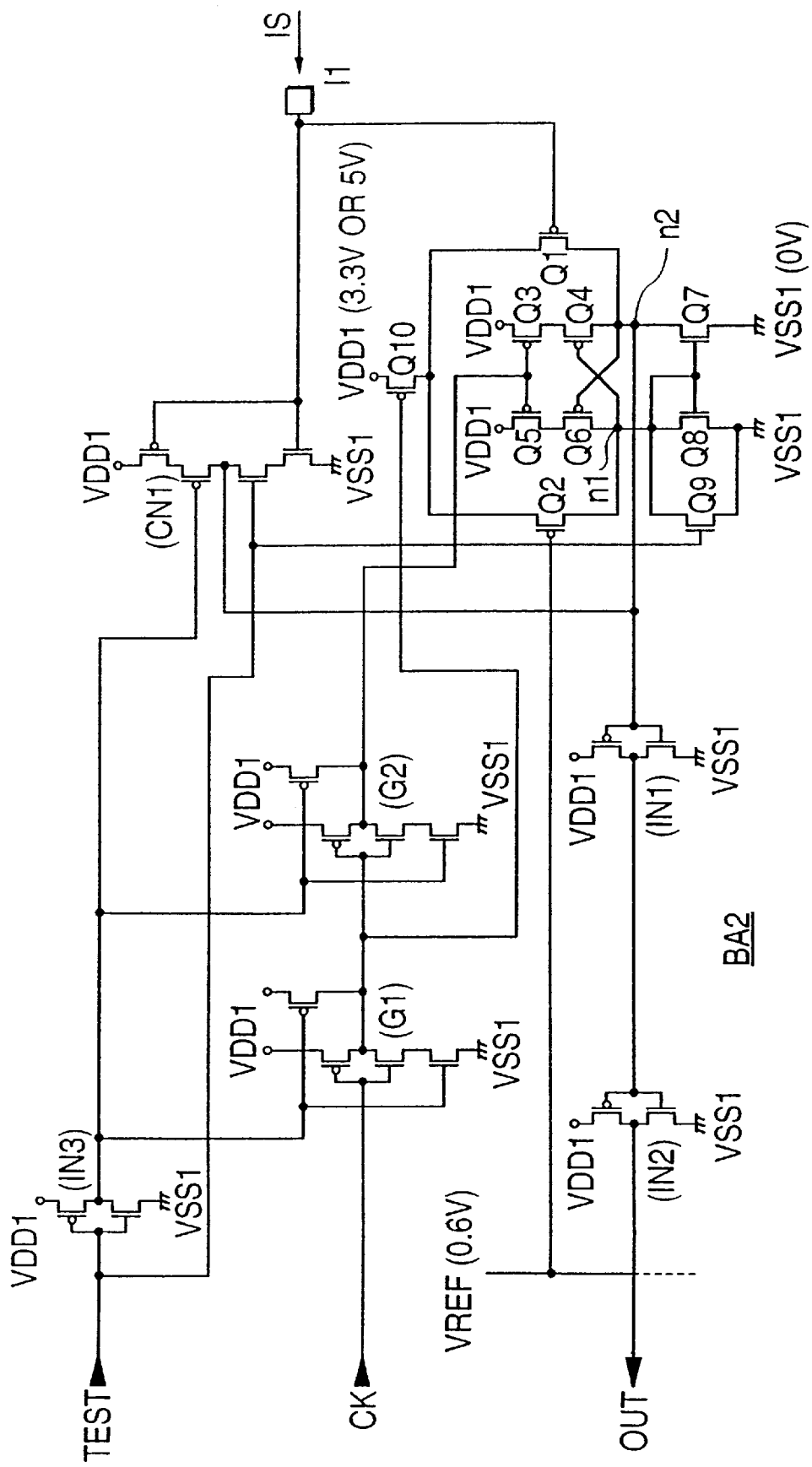
FIG. 2 is a circuit diagram illustrating one embodiment of the input buffer of FIG. 1.
Figure 5:
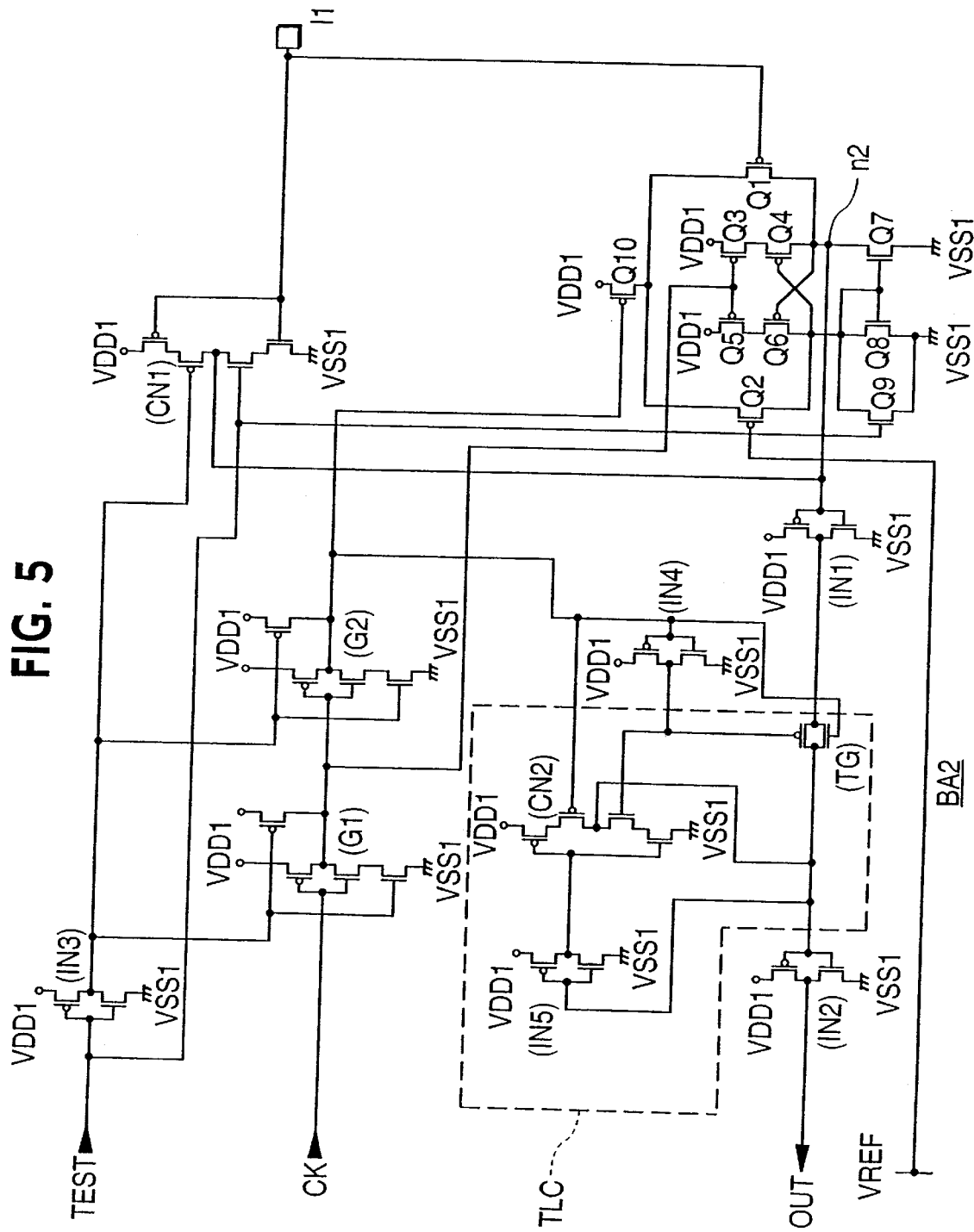
FIG. 5 is a circuit diagram illustrating another embodiment of the input buffer of FIG. 1.
Figure 6:
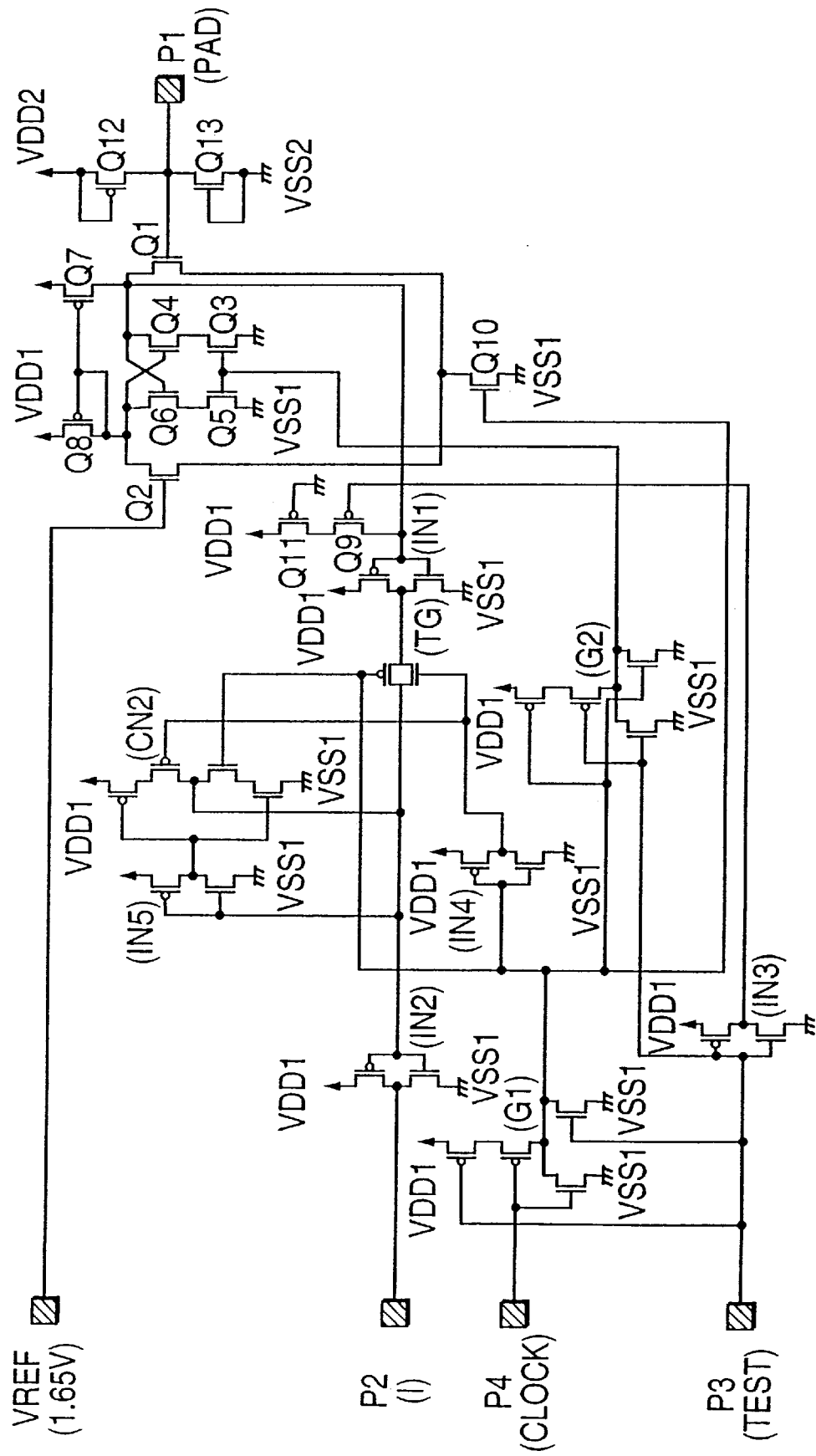
FIG. 6 is a circuit diagram illustrating another embodiment of the input buffer of FIG. 1.
Figure 7:
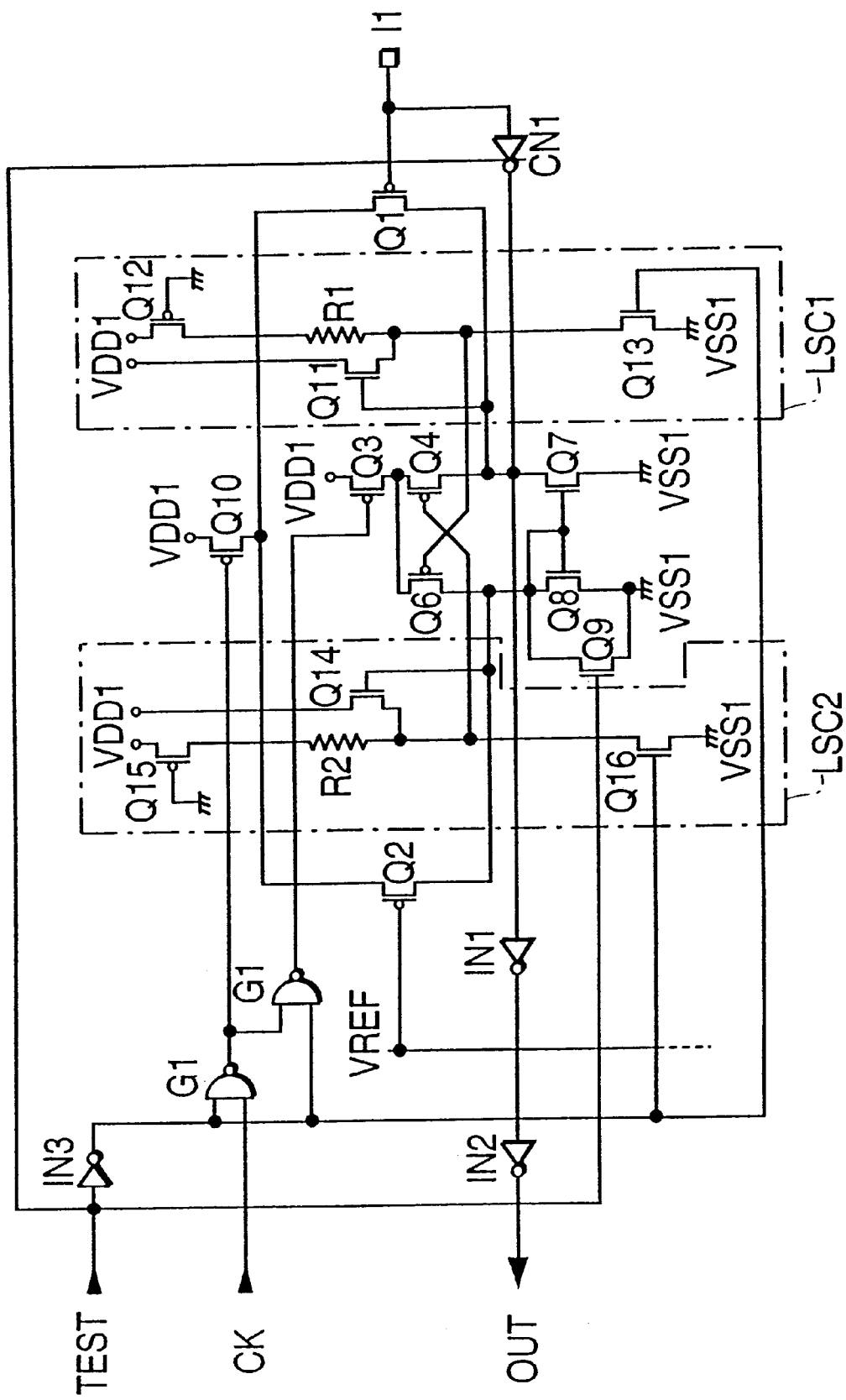
FIG. 7 is a circuit diagram illustrating another embodiment of the input buffer of FIG. 1.

FIG. 2 shows a circuit diagram of one embodiment of the input buffer BA2. Each of the circuit elements in FIG. 2 as well as FIGS. 5 to 7, is formed on one semiconductor substrate along with other circuits, not shown, by known CMOS integrated circuit fabrication technologies. In the figure, a p-channel or a first conductivity type MOSFET is indicated with a circle at its gate thereof to make distinction from an n-channel or a second conductivity type MOSFET.

The input signal IS inputted or entered from an external input terminal I1 is supplied to the gate of a p-channel MOSFET Q1. The gate of a p-channel MOSFET Q2, which is connected to the MOSFET Q1 to form a differential pair of transistors, is supplied with a reference voltage VREF that corresponds to an intermediate potential between the high and low levels of the input signal IS entered from the input terminal I1. For this reason, the MOSFETs Q1 and Q2 are made to be a pair of differential transistors or a differential pair of transistors. This reference voltage VREF is also supplied to the gates of other differential MOSFETs corresponding to the MOSFET Q2 in other input buffers provided in the receiving LSI 2.

Between the common source of the differential MOSFETs Q1 and Q2 and the supply voltage VDD1(3.3V or 5V), a p-channel current-source or current-switch MOSFET Q10 that conducts an operating current for the differential MOSFETs Q1 and Q2 is provided. Namely, the source-drain path of the MOSFET Q10 is coupled between the common source of the differential MOSFETs and a line to the supply voltage VDD1 is supplied. The gate of this MOSFET Q10 is supplied with an inverted signal of the clock signal CK formed by a NAND gate circuit G1. Between the drains of the differential MOSFETs Q1 and Q2 and a line to which the ground potential VSS1(0V) is supplied, n-channel load MOSFETs Q7 and Q8 connected in current-mirror manner are provided as load means or load elements, although the invention is not limited to this particular arrangement.

In the present embodiment, an amplification factor to be determined by element constants of the differential MOSFETs Q1 and Q2, load MOSFETs Q7 and Q8, and constant current-source MOSFET Q10 as a first MOSFET is set to about 1. The drain voltages of the MOSFETs Q1 and Q2 are level-shifted in direct current manner, respectively, the signal amplitude thereof being made to be nearly the same as the signal amplitude of the input signal.

In the present embodiment, p-channel MOSFETs Q4 and Q6 of latch type, having drains and gates are cross-connected or cross-coupled to each other and which are formed as a latch circuit, are provided for the differential MOSFETs Q1 and Q2 in order to provide a latch capability for the input buffer BA2. Namely, the cross-connected gates and drains of the MOSFETs Q4 and Q6 of latch type are connected to the corresponding drains of the differential MOSFETs Q1 and Q2, respectively, to commonly use the load MOSFETs Q7 and Q8.

In order to operate the MOSFETs Q4 and Q6 of latch type complementary with the differential MOSFETs Q1 and Q2 in synchronization with the clock signal CK, namely, to put the differential MOSFETs Q1 and Q2 in the operating state when the input signal IS is captured and, after that, to hold the captured input signal captured by the differential MOSFETs Q1 and Q2 in the MOSFETs Q4 and Q6 of latch type, switch MOSFETs Q3 and Q5 corresponding to the current-switch MOSFET Q10 are provided between the sources of the MOSFETs Q4 and Q6 and the supply voltage VDD1, respectively, although the invention is not necessarily limited to this arrangement. The gates of the MOSFETs Q3 and QS are supplied with a clock signal provided with the same phase as the clock signal CK through the NAND gates G1 and G2. The switch MOSFETs Q3 and Q5 may be replaced with one switch MOSFET as a second MOSFET like the MOSFET Q10 provided for the differential MOSFETs Q1 and Q2. In this case, a source-drain path of the one switch MOSFET is coupled between the sources of the MOSFETs Q4 and Q6 and a line to which the supply voltage VDD1 is supplied.

An internal signal on the drain of the differential MOSFET Q1 for receiving the input signal IS is amplified from a low-voltage signal as mentioned above to the high or low level corresponding to the supply voltages VDD1 or VSS1 by the CMOS inverter circuits IN1 and IN2 composed of p-channel and n-channel MOSFETs to be outputted as a signal OUT which is supplied to the internal combined logic circuit INT shown on FIG. 1, but not limited thereto. These CMOS inverter circuits IN1 and IN2 may also be constituted such that the same are built in the combined logic circuit INT.

The input buffer BA2 of the present embodiment is provided with a test capability. This test capability is used to select a CMOS input buffer having no latch function for a standby current test which tests the standby current of all of the circuits in the receiving LSI 2, for example. A test mode signal TEST may be supplied with an external terminal of the receiving LSI 2 or may be generated from a circuit provided inside of the receiving LSI 2. The test mode signal TEST is supplied to a CMOS inverter circuit IN3 composed of p-channel and n-channel MOSFETs to form an inverted signal. The test signal TEST and the inverted signal formed by the inverter circuit IN3 are supplied to the gates of the n-channel and p-channel MOSFETs that constitute a clocked inverter (three-state output circuit) circuit CN1. The input terminal I1 is connected to the gates of the p-channel and n-channel MOSFETs that provide the inputs to the clocked inverter circuit CN1. The output terminal of the clocked inverter circuit CN1 is connected to the input terminal of the CMOS inverter circuit IN1 that amplifies the latched low-voltage signal.

The inverted signal of the test mode signal TEST formed by the inverter circuit IN3 is used for a gate control signal for NAND gate circuits G1 and G2 that receive the clock signal CK. Namely, in a normal operation, the test mode signal TEST is made low. This makes the output signal of the inverter circuit IN3 high, after which the clocked inverter circuit CN1 is put in the output high-impedance state and the NAND gates G1 and G2 open the gates thereof to substantially operate as inverter circuits.

In such a normal operation, when the clock signal CK is high, the output signal of the NAND gate circuit G1 goes low and the output signal of the NAND gate circuit G2 goes high. When the output signal of the NAND gate circuit G1 goes low, the p-channel MOSFET Q10 provided for the common source of the differential MOSFETs Q1 and Q2 is turned on, upon which the differential MOSFETs Q1 and Q2 are put in the active state, etching the input signal IS entered from the input terminal I1. At this moment, when the output signal of the NAND gate G2 goes high, the p-channel MOSFETs Q3 and Q5 provided for the sources of the latch MOSFETs Q4 and Q6 are turned off. At this time, the latch MOSFETs Q4 and Q6 are put in the inactive state.

When the above-mentioned clock signal CK changes from high to low, the p-channel MOSFET Q10 provided for the common source of the above-mentioned differential MOSFETs Q1 and Q2 is turned off and the p-channel MOSFETs Q3 and Q5 provided for the sources of the latch MOSFETs Q4 and Q6 are turned on. In response to the on-state of the MOSFETs Q3 and Q5, the latch MOSFETs Q4 and Q6 are put in the active state to hold the drain voltages of the differential MOSFETs Q1 and Q2. Thus, the input signal IS inputted from the input terminal I1 is latched in synchronization with the high level of the clock signal CK and the voltage or signal level thereof is held at a period when the clock signal CK is low.

On the other hand, when the test mode signal TEST goes high, the n-channel MOSFET Q9 provided in parallel to the load MOSFET Q8 is turned on so that the load MOSFETs Q8 and Q7 are turned off. In response to the high level of the test mode signal TEST, the output signal of the NAND gate circuits G1 and G2 goes high regardless of the clock signal CK. As a result, the switch MOSFETs Q10 and Q3 and Q4 are turned off, and the input section of the input buffer BA2 is put in the floating state. Then, the clocked inverter circuit CN1 is put in the active state to latch a test input signal inputted from the input terminal I1, the latched input signal being transmitted to the input of the CMOS inverter circuit IN1. Thus, in the test mode, the input buffer BA2 and the latch circuit made of the MOSFETs Q4 and 6 are put in the inactive state, and the clocked inverter circuit CN1 in the active state, in which the input signal for testing inputted from the input terminal I1 is transmitted to the internal circuit INT without change.

Figure 3:
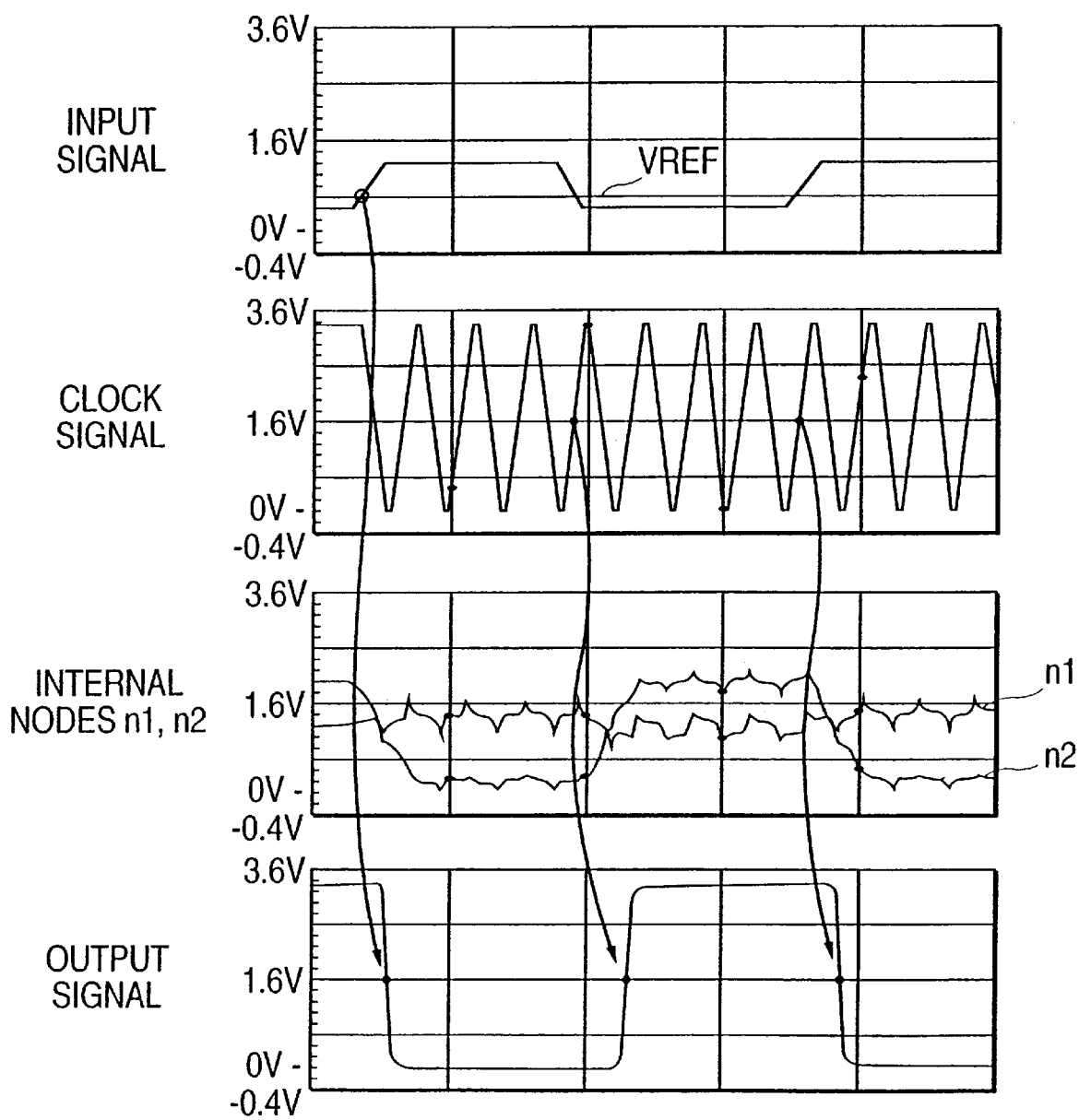
FIG. 3 is a waveform diagram describing the operations of the input buffer associated with the present invention.

FIG. 3 shows a diagram illustrating an operation waveform for describing the operation of the input buffer BA2 associated with the present invention. In FIG. 3, waveforms obtained by computer simulation with the clock signal CK set to a high frequency such as 400 MHz are shown.

The input signal is supplied to the gate of the differential MOSFET Q1 as a low-voltage and low-amplitude signal with a low level being 0.4 V and a high level being 1.2 V. The gate of the differential MOSFET Q2 is supplied with the reference voltage VREF such as 0.6 V. The waveforms of internal nodes n1 and n2 are waveforms at the connection point n1 between the drain of the differential MOSFET Q2, the gate of the latch MOSFET Q4 and the drain of the latch MOSFET Q6 and at the connection point n2 between the drain of the differential MOSFET Q1, the gate of the latch MOSFETs Q6 and the drain of the latch MOSFETs Q4, as shown in FIG. 2.

Of the current-mirror load MOSFETs Q7 and Q8 in the input buffer BA2, the potential on the internal node n1 at the drain side of the MOSFET Q2 (Q6) connected with the MOSFET Q8 in diode form is set to a comparatively stable potential around 1.2 V correspondence with the threshold voltage between the gate and the source of the MOSFET Q8. The internal node n2 or the drain potential of the MOSFET Q1 (Q4) connected with the MOSFET Q7 is relatively changed in corresponding to the amplitude of the input signal IS. It will be apparent to those skilled in the art that the signal of this internal node n2 is substantially held at the low voltage corresponding to the input signal IS kept as it is. The signal of the internal node n2 is amplified by the CMOS inverter circuits IN1 and IN2 to provide an output signal such as shown in FIG. 3 having a high level such as 3.3 V corresponding to the supply voltage and a low level such as the circuit ground potential VSS1 (0 V).

Figure 4:
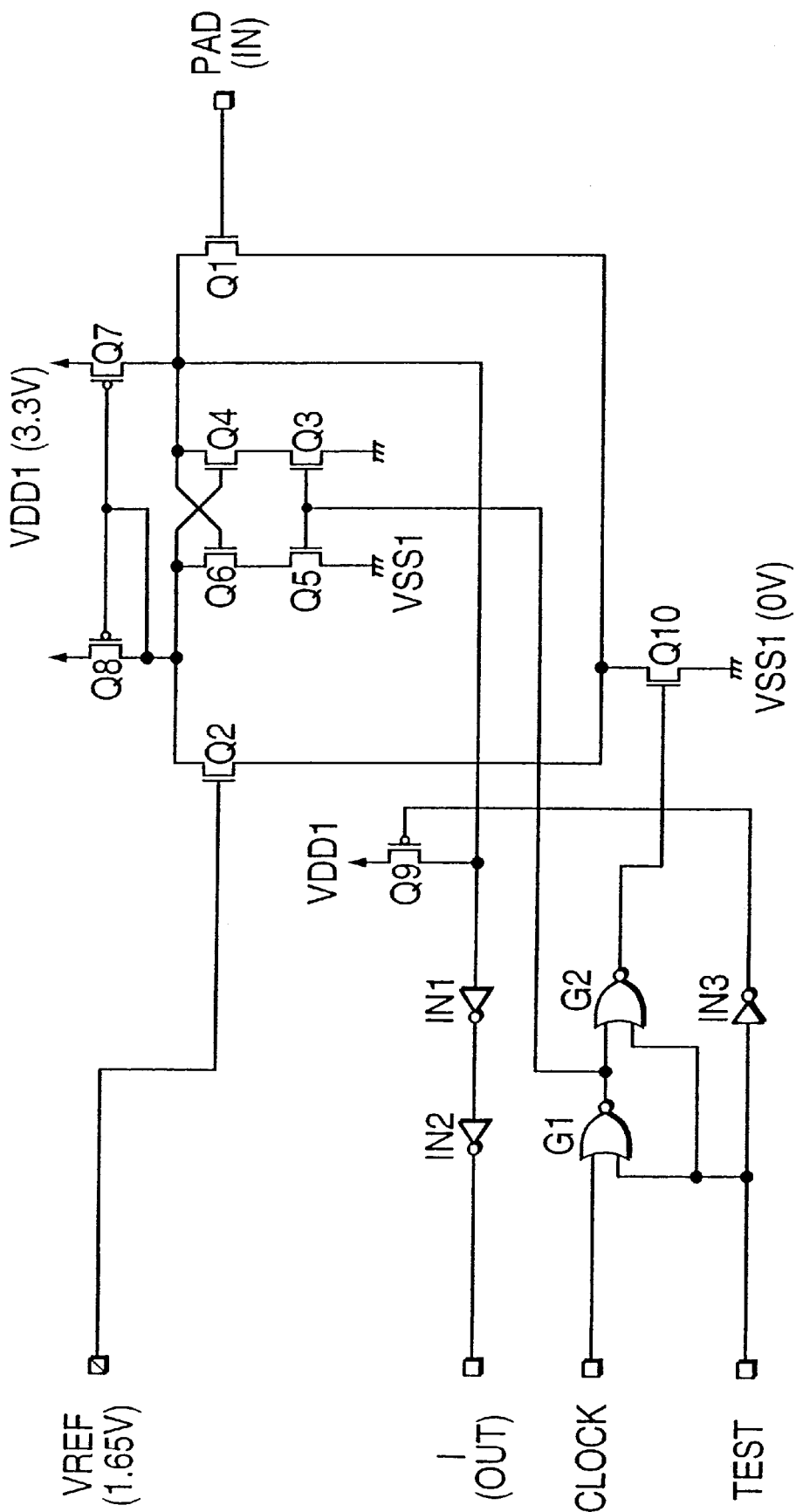
FIG. 4 is a circuit diagram illustrating another embodiment of the input buffer of FIG. 1.

FIG. 4 shows a circuit diagram illustrating another embodiment of the input buffer BA2. As compared with the embodiment of FIG. 2, the conductivity types of the MOSFETs constituting the differential circuit and the latch circuit are all inverted in the embodiment of FIG. 4. Namely, the differential MOSFETs Q1 and Q2, the latch MOSFETs Q4 and Q6 and the switch MOSFETs Q10, Q3, and Q5 are each composed of an n-channel MOSFET, while the load MOSFETs Q8 and Q7 and the switch MOSFET Q9 are each composed of a p-channel MOSFET.

According to the inverted conductivity types of the MOSFETs mentioned above, the NAND gates G1 and G2 in FIG. 2 are replaced with NOR gates G1 and G2 with the test mode signal TEST supplied without change as their control signal. For a test mode signal that controls the operations of the load MOSFETs Q8 and Q7, a signal inverted by the inverter circuit IN3 is also used. When the test mode signal TEST goes high, the load MOSFETs Q7 and Q8 are turned off upon turning on of the p-channel MOSFET Q9 and, at the same time, the input of the CMOS inverter circuit IN1 for amplification is fixed to the supply voltage VDD1. Namely, the clocked inverter circuit CN1 as mentioned above is omitted and, at the time of testing, the input from the external input terminal IN is disabled and the high level of the supply voltage VDD1 is regarded as the input signal.

Thus, differential amplification or signal latching by use of n-channel MOSFETs requires to allocate the operating bias voltages of the n-channel MOSFETs even if the input signal has the same low voltage and the same low amplitude. Namely, it is required to allocate the threshold voltage between the gate and the source of each of the differential MOSFETs Q1, Q2 and the latch MOSFETs Q4 and Q6, and the voltage between the drain and the source of each of the MOSFETs Q10, Q3 and Q5 that conduct the flow of the operating current. For this reason, with a signal biased toward the circuit ground potential side such as 0.4 V to 1.2 V as with the GTL level, the above-mentioned operating bias voltage cannot be allocated, thereby requiring the use of the p-channel MOSFETs as used in the embodiment of FIG. 2.

The input buffer of the present embodiment is directed to a pseudo ECL signal or LVTTL (low voltage TTL signal). The pseudo ECL signal has a high level such as 2.2 volt and a low level such as 1.8 volt. The LVTTL has a high level such as 2.0 volt and a low level such as 0.8 volt. For example, in the case of a pseudo ECL that operates with reference to an operating voltage of 3.3 V, 1.65 V is used for the reference voltage VREF. Thus, the embodied circuit of FIG. 4 operates corresponding to a signal obtained by shifting the low-voltage signal to be entered entirely to the supply voltage VDD1 side. In this embodiment, the signal input, latch, and test operations are substantially the same as those of the embodiment of FIG. 2 and therefore omitted from the description herein.

FIG. 5 shows a circuit diagram illustrating still another embodiment of the input buffer BA2. In the figure, an edge trigger capability is added to the embodied circuit shown on FIG. 2. Namely, a through-latch circuit TLC is inserted between the inverter circuits IN1 and IN2 that amplify the signal of the internal node n2 at which the signal capture and latch are performed with the low voltage kept as it is in the input section of the input buffer BA2. A transfer gate circuit TG of CMOS constitution is provided on the output section of the inverter circuit IN1 to provide the input gate, with which the latch circuit TLC is constituted along with an inverter circuit IN5 and a clocked inverter circuit CN2 as amplifiers.

Accordingly, the transfer gate circuit TG is turned on to pass the input signal as it is during a period in which the clock signal CK is high, namely, the input signal is to be captured. The transfer gate circuit TG is turned off at the timing (edge) at which the clock signal CK changes from the high level to the low level, thereby latching the output signal by the inverter circuit IN5 and the clocked inverter circuit CN2.

As the input buffer circuit BA2 in this embodiment is controlled by the edges of the clock signal CK, it is unnecessary to use a relatively complicated design that controls the pulse width of the clock signal CK such as the level sensitive type input circuit in the embodiment shown on FIG. 2.

FIG. 6 shows a circuit diagram illustrating yet another embodiment of the above-mentioned input buffer BA2. In the figure, an edge trigger capability is added to the embodied circuit of FIG. 4. In the present embodiment, the circuits are changed in the same manner as mentioned above corresponding to the inversion of the MOSFET conductivity types. When the test mode signal TEST goes high, the p-channel MOSFET Q9 is turned on to forcibly fix the input signal of the amplifying CMOS inverter circuit IN1 to the high level, disabling the input from the external input terminal P1(PAD), thus achieving simplification. A p-channel MOSFET Q12 and an n-channel MOSFET Q13 provided on the input terminal P1 constitute a static protection circuit for protecting a gate oxide film of the input transistor Q1 from static destruction. Although the static protection circuit is omitted from the portions of the external input terminal I1 or P1(PAD) in the above-mentioned embodiments shown on FIGS. 2, 4 and 5, this static protection circuit (Q12 and Q13) or a static protection circuit of another appropriate constitution may be provided at these portions.

FIG. 7 shows a circuit diagram illustrating a further embodiment of the input buffer BA2. In the input buffers in the embodied circuits of FIGS. 2 through 6, because a current-mirror circuit is used for a load circuit, the low-voltage signal at the internal nodes n1 and n2 in the input buffer BA2 provides irregular differential signals such that the output level of the diode load MOSFET Q8 becomes nearly constant, as shown in the waveform of FIG. 3, and the output level of the other load MOSFET Q7 changes.

In the present embodiment, a level shift circuit LSC1 is provided at the gates of the latch MOSFETs Q4 and Q6 to adjust the levels of the irregular differential signals. Namely, the drain output of the differential MOSFET Q1 is supplied to the gate of an MOSFET Q11 and the signal level is adjusted by the level shift circuit LSC1 composed of the MOSFET Q11, a resistor element R1, and an MOSFET Q13 to be transmitted to the gate of the MOSFET Q6. Likewise, the drain output of the differential MOSFET Q2 is level-adjusted by a level shift circuit LSC2 composed of an MOSFET Q14, a resistor element R2, and an MOSFET Q16 to be transmitted to the gate of the MOSFET Q4.

The level shift circuits LSC1 and LSC2 operate such that the absolute values of the high and low levels of the signal to be transmitted to the gates of the MOSFETs Q4 and Q6 are set to approximately the same level. Namely, when the gate of the MOSFET Q4 is high, the gate of the MOSFET Q6 is low. However, when the gate of the MOSFET Q4 is switched to low, the signal is set to about the same low level as supplied to the MOSFET Q6 and when the gate of the MOSFET Q6 is switched to high, the signal is set to about the same high level as supplied to the MOSFET Q4. Thus, the gate voltages of a pair of the MOSFETs Q4 and Q6 in the latch form are mutually switched to high/low level, so that a stable signal holding operation can be ensured with the small amplitude of the signal as it is.

As mentioned above and according to the invention, the following functions can be obtained from the above-mentioned embodiments of the invention:

(1) A simple constitution is provided in which the input buffer BA2 includes a latch circuit that receives a received signal entered in synchronization with a clock signal, wherein the received signal has a low voltage and a low amplitude relative to the amplitude between the first supply voltage (VDD1) and the second supply voltage (VSS1). The latch circuit also holds the received signal with the amplitude thereof kept correspondingly low. This novel constitution eliminates a delay time required for amplifying a low-voltage signal to a signal of full amplitude corresponding to the amplitude between the first supply voltage (VDD1) and the second supply voltage (VSS1) for signal transfer, thereby enhancing data transfer speed.

(2) The input buffer is used for a received signal transmitted along a signal transmission line terminated with a terminating resistor element, so that the semiconductor integrated circuit device according to the present invention is suitable for a semiconductor integrated circuit device that performs data transfer with low power consumption and at high speeds.

(3) The input buffer is constituted such that the differential MOSFETs which are operated when the clock signal to be entered in synchronization with a receive signal is at one level to receive the receive signal and reference voltage are put in active state, the latch MOSFETs which are operated when the clock signal is at the other level are put in active state, the load means is provided commonly to the corresponding drains of the differential MOSFETs and the latch MOSFETs, and an amplifier amplifies one drain voltage of the differential MOSFETs to form internal signals corresponding to the above-mentioned one and the other operating voltages as the first and the second supply voltages. The novel constitution can hold the receive signal with the small signal amplitude corresponding to the receive signal kept as it is and eliminates a delay time required for amplifying a low-voltage signal to a signal of full amplitude corresponding to a supply voltage for capturing the receive signal, thereby enhancing data transfer speed.

(4) The input buffer is provided with a test input buffer in parallel having a three-state output capability, an output of the test input buffer being put in a high impedance state by a test mode signal in a normal operation, and the test input buffer being put in an operating state by the test mode signal in a test mode while an output of the input buffer for signal receiving is put substantially in a high-impedance state. The novel constitution allows execution of a standby current test.

(5) The amplifying circuit is provided with input and output CMOS inverter circuits and a through-latch circuit composed of a CMOS circuit controlled by the clock signal and provided between the output of the input CMOS inverter circuit and the input of the output CMOS inverter circuit. The novel constitution allows to add a latch capability based on an edge trigger.

(6) When signal transmission is performed between two semiconductor integrated circuit devices in synchronization with a clock signal using a small signal amplitude relative to a operating voltage of the two semiconductor integrated circuit devices, a receive signal is held on the receiving semiconductor integrated circuit device in synchronization with the clock signal with the small signal amplitude kept without change, and the receive signal having the small signal amplitude is amplified along a signal transmission path including a combined logic circuit to a subsequent latch circuit on the receiving semiconductor integrated circuit device. The novel constitution enhances data transfer speed.

(7) The signal transmission using said small signal amplitude is performed by a signal line and a terminating resistor provided on an end of said signal line, so that this signal receiving method is suitable for low-power consumption and high-speed data transfer.

The above-mentioned signal transmission using said small signal amplitude is performed by a signal line and a terminating resistor provided on an end of said signal line, so that this signal receiving method is suitable for low-power consumption and high-speed data transfer.

While the preferred embodiments of the present invention have been described using specific terms, such description is for illustrative purposes only, and it is to be understood that changes and variations may be made without departing from the spirit or scope of the appended claims. For example, the load MOSFETs provided at the drains of the differential MOSFETs and the latch MOSFETs may be resistor means or resistor elements including MOSFETs that operate as resistance in addition to the above-mentioned current-mirror load circuit. The signals to be transferred between semiconductor integrated circuits may be any that have a low voltage relative to the operating voltage in the semiconductor integrated circuit in addition to the GTL and pseudo ECL. The present invention can be widely applied to semiconductor integrated circuit devices in which input signals having a low voltage relative to the supply voltage are transmitted and methods of receiving such low-voltage input signals.

The effects to be achieved by the typical embodiments of the present invention are briefly described as follows.

A simple constitution is provided in which an input buffer includes a latch circuit that receives an input signal entered in synchronization with a clock signal, wherein the input signal is provided with a low voltage and a low amplitude relative to the amplitude between the first supply voltage and the second supply voltage, and holds the receive signal with the amplitude thereof kept correspondingly low. This novel constitution eliminates a delay time required for amplifying a low-voltage signal to a signal of full amplitude corresponding to the amplitude between the first supply voltage and the second supply voltage for signal transfer, thereby enhancing data transfer speed.

The input buffer is also used for an input signal transmitted along a signal transmission line terminated with a terminating resistor, so that the semiconductor integrated circuit device according to the present invention is suitable for a semiconductor integrated circuit device that performs data transfer with low power consumption and at high speeds.

The above-mentioned input buffer is constituted such that differential MOSFETs which are turned on when the clock signal to be entered in synchronization with a received signal is at one level to receive the receive signal and reference voltage is put in active state, latch MOSFETs which are turned on when the clock signal is on the other level are put in active state, a load means is provided commonly to the corresponding drains of the differential MOSFETs and the latch MOSFETs, and an amplifier amplifies one drain voltage of the differential MOSFETs to form internal signals corresponding to the one and the other operating voltages as the first and the second supply voltages. The novel constitution can hold the received signal with the small signal amplitude corresponding to the received signal kept as it is and eliminates a delay time required for amplifying a low-voltage signal to a signal of full amplitude corresponding to a supply voltage for capturing the receive signal, thereby enhancing data transfer speed.

The input buffer is provided with a test input buffer in parallel having a three-state output capability, an output of the test input buffer being put in a high impedance state by a test mode signal in a normal operation, and the test input buffer being put in an operating state by the test mode signal in a test mode while an output of the input buffer for signal receiving is put substantially in a high-impedance state. The novel constitution allows execution of a standby current test.

The amplifying circuit is provided with input and output CMOS inverter circuits and a through-latch circuit composed of a CMOS circuit controlled by the clock signal and provided between the output of the input CMOS inverter circuit and the input of the output CMOS inverter circuit. The novel constitution allows adding a latch capability based on an edge trigger.

When signal transmission is performed between two semiconductor integrated circuit devices in synchronization with a clock signal using a small signal amplitude relative to an operating voltage of the two semiconductor integrated circuit devices, a received signal is held on the receiving semiconductor integrated circuit device in synchronization with the clock signal with the small signal amplitude kept without change, and the received signal having the small signal amplitude is amplified along a signal transmission path including a combined logic circuit to a subsequent latch circuit on the receiving semiconductor integrated circuit device. The novel constitution enhances data transfer speed.

The signal transmission using the small signal amplitude is performed by a signal line and a terminating resistor provided on an end of said signal line, so that this signal receiving method is suitable for low-power consumption and high-speed data transfer.

We claim:

1. A semiconductor integrated circuit device operated between a first and a second voltage, the semiconductor integrated circuit device comprising:

an external input terminal for receiving an external input signal having a first amplitude which is smaller than a potential difference between the first and the second voltages;

an input circuit comprising:
  a first MOSFET having a gate coupled to the external input terminal, a source and a drain;
  a second MOSFET having a gate coupled to receive a reference voltage, a source coupled to the source of the first MOSFET and a drain;
  a current-source transistor coupled to the respective sources of the first and the second MOSFETs and providing an operation current for the first and the second MOSFETs; and
  a latch circuit responsive to a clock signal and latching an output of the first and the second MOSFETs, the latch circuit including:
    a third MOSFET having a source, a drain coupled to the drain of the first MOSFET and a gate coupled to the drain of the second MOSFET, wherein a latch circuit output signal is provided from the drain thereof and has a second amplitude which is smaller than the potential difference between the first and the second voltages;
    a fourth MOSFET having a source, a drain coupled to the drain of the second MOSFET and a gate coupled to the drain of the first MOSFET; and
    a circuit coupled to receive the clock signal and coupled to the third and the fourth MOSFETs and controlling the third and the fourth MOSFETs to latch a signal corresponding to the input signal in synchronization with the clock signal, and
    a signal amplifier coupled to receive the latch circuit output signal of the latch circuit and to provide an output signal having a third amplitude which is substantially equal to the potential difference between the first and the second voltages.

2. A semiconductor integrated circuit device according to claim 1, wherein the signal amplifier is a CMOS circuit operated between the first and the second voltages.

3. A semiconductor integrated circuit device according to claim 1, further comprising:

an internal circuit coupled to the output signal of the signal amplifier.

4. A semiconductor integrated circuit device according to claim 1, wherein the first voltage is 3.3 volt or 5.0 volt, wherein the second voltage is 0 volt, wherein the signal amplitude of the input signal is 0.8 volt, and wherein the reference voltage is 0.6 volt.

* * * * *